United States Patent
Shiotsuka et al.

[11] Patent Number: 6,130,379
[45] Date of Patent: Oct. 10, 2000

[54] PROTECTIVE MATERIAL FOR A SEMICONDUCTOR ELEMENT, A SEMICONDUCTOR ELEMENT PROVIDED WITH SAID PROTECTIVE MATERIAL, AND A SEMICONDUCTOR DEVICE PROVIDED WITH SAID SEMICONDUCTOR ELEMENT

[75] Inventors: Hidenori Shiotsuka, Tsuzuki-gun; Takahiro Mori, Ikoma; Ichiro Kataoka; Satoru Yamada, both of Tsuzuki-gun; Ayako Komori, Nara, all of Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/680,799
[22] Filed: Jul. 16, 1996

[30] Foreign Application Priority Data

Jul. 19, 1995 [JP] Japan .................................. 7-182954
Jul. 10, 1996 [JP] Japan .................................. 8-181049

[51] Int. Cl.[7] .................................................. H01L 31/048
[52] U.S. Cl. ........................ 136/251; 136/259; 257/433; 257/790; 257/791
[58] Field of Search ..................... 136/251, 259; 257/433, 790–791; 106/287.13

[56] References Cited

U.S. PATENT DOCUMENTS

| | | | |
|---|---|---|---|
| 4,729,970 | 3/1988 | Nath et al. | 437/225 |
| 5,344,498 | 9/1994 | Inoue | 136/251 |
| 5,344,501 | 9/1994 | Hashimoto et al. | 136/259 |
| 5,482,571 | 1/1996 | Yamada et al. | 136/259 |
| 5,530,264 | 6/1996 | Kataoka et al. | 257/40 |

*Primary Examiner*—Nam Nguyen
*Assistant Examiner*—Mike Miggins
*Attorney, Agent, or Firm*—Fitzpatrick, Cella, Harper & Scinto

[57] ABSTRACT

A highly reliable surface covering material for a semiconductor element or a semiconductor device having a specific transparent resin layer formed of a resin containing a silane coupling agent in a state with no free material of said silane coupling agent. The element or device is free of the occurrence of layer separation, has satisfactory heat resistance, is hardly yellowed. The element semiconductor element or semiconductor device effectively maintains its characteristics without deterioration, even when repeatedly used over a long period of time under severe environmental conditions with a high temperature and a high humidity.

46 Claims, 4 Drawing Sheets

PROTECTIVE MATERIAL FOR A SEMICONDUCTOR ELEMENT, A SEMICONDUCTOR ELEMENT PROVIDED WITH SAID PROTECTIVE MATERIAL, AND A SEMICONDUCTOR DEVICE PROVIDED WITH SAID SEMICONDUCTOR ELEMENT

BACKGROUND OF THE INVENTION

1. Field of the Invention

The present invention relates to an improved, reliable protective material for a semiconductor element, a semiconductor element provided with said protective material, and a semiconductor device provided with said semiconductor element. More particularly, the present invention relates to an improved, reliable protective material which can be disposed at the surface of a semiconductor element including a photoelectric conversion element such as a solar cell element, specifically, which is suitable for use as a surface covering material disposed on the light incident side of said photoelectric conversion element. The present invention also relates to a semiconductor element including a photoelectric conversion element such as a solar cell element which is provided with said protective material, and a semiconductor device provided with said semiconductor element.

2. Related Background Art

In recent years, societal concern for the problems relating to the environment and energy sources has been increasing all over the world. Particularly, heating of the earth because of the so-called greenhouse effect due to an increase of atmospheric $CO_2$ has been predicted to cause a serious problem. In view of this, there is an increased demand for a means of power generation capable of providing clean energy without causing $CO_2$ buildup.

Public attention has been focused on solar cells in order to meet such demand, because they can supply electric power without causing such a problem as above mentioned and are expected to be a future power generation source, and they are safe and easy to handle.

Such solar cells include single crystal silicon solar cells, polycrystal silicon solar cells, amorphous silicon solar cells (including microcrystal silicon solar cells), copper indium selenide solar cells, and compound semiconductor solar cells. Of these solar cells, various studies have been made on so-called thin film crystal silicon solar cells, compound semiconductor solar cells, and amorphous silicon solar cells since their semiconductor active layer can be relatively easily formed in a large area and in a desired form and they therefore can be easily produced at a relatively low production cost.

Particularly, thin film amorphous solar cells, specifically, amorphous silicon solar cells, comprising an electrically conductive metal substrate, an amorphous silicon semiconductor active layer disposed on said metal substrate, and a transparent and conductive layer disposed on said semiconductor active layer have been evaluated as being the most advantageous among the conventional solar cells because their semiconductor active layer comprised of amorphous silicon (hereinafter referred to as a-Si) can be easily formed in a large area and in a desired form on a relatively inexpensive substrate with a low production cost and they are light and excel in shock resistance and flexibility, and in addition, they can be designed into a solar cell module in a desired configuration which can be used as a power generation source.

Now, in the case of an amorphous silicon solar cell having a semiconductor active layer comprising, for example, an a-Si thin film disposed on a glass plate as a substrate, light is impinged through the substrate side, and because of this, the glass plate can be designed to serve as a protective member. However, in the case of the aforementioned solar cell having the a-Si semiconductor active layer disposed on the metal substrate, because the metal substrate does not permit incident light to transmit therethrough, light is impinged through the side opposite the metal substrate, and therefore, it is necessary to dispose an appropriate transparent protective member on the side through which light is impinged such that it protects the solar cell element.

SUMMARY OF THE INVENTION

In the conventional semiconductor devices (including the conventional solar cell modules) having a photoelectric conversion element such as a solar cell element, the light incident side of the photoelectric conversion element is protected by a surface covering material comprising a transparent fluorine-containing polymer film comprised of a fluororesin or a fluororesin-containing composition as a surface protective member which is positioned at the outermost surface and a transparent thermoplastic resin as a filler which is positioned under the transparent fluorine-containing polymer film.

The fluorine-containing polymer film is often used in the above described manner, since it is advantageous in that it is satisfactory in terms of weatherability and water-repellency and serves to reduce deterioration in the photoelectric conversion efficiency of the photoelectric conversion element caused due to a reduction in the transmittance of the surface protective member which occurs when the protective member is yellowed or clouded as a result of the protective member having been deteriorated. As for the thermoplastic resin used as the filler in combination with the fluorine-containing polymer film, it is also often used since it is relatively inexpensive and suitable for protecting the photoelectric conversion element and it therefore can be used in a relatively large amount.

Now, description will be made of such a semiconductor device (a solar cell module).

FIG. 1 is a schematic cross-sectional view of an example of the solar cell module. In FIG. 1, reference numeral 101 indicates a transparent fluorine-containing polymer thin film layer as an outermost surface protective layer, reference numeral 102 a transparent thermoplastic resin layer which is situated under the fluorine-containing thin film layer 101, reference numeral 106 a solar cell element comprising a photovoltaic element 104 and a transparent resin thin film layer 103 disposed on the surface of said photovoltaic element, and reference numeral 105 an insulating layer. In this solar cell module, the solar cell element 106 is enclosed by the transparent thermoplastic resin layer 102 which serves as a filler.

Specifically, the fluorine-containing polymer thin film layer 101 comprises a fluororesin film selected from the group consisting of ETFE (ethylene-tetrafluoro-ethylene copolymer) film, PVF (polyvinyl fluoride) film, and the like. The transparent thermoplastic resin layer 105 comprises a thermoplastic resin selected from the group consisting of EVA (ethylene-vinyl acetate copolymer), EEA (ethylene-acrylic ester copolymer), and butyral resin. The transparent resin thin film layer 103 comprises a resin film composed of an acrylic resin, a fluororesin, or an acrylic resin crosslinked with an inorganic polymer. The insulating layer 105 comprises an organic resin film such as nylon film, TEDLAR (trademark name, laminated aluminum foil), or the like.

In the above described solar cell module, the transparent thermoplastic resin layer 102 serves not only as an adhesive between the photovoltaic element 104 and the fluororesin film 101 as the surface protective layer but also as an adhesive between the photovoltaic element and the insulating layer 105. The transparent resin thin film layer 103 disposed on the photovoltaic element 104 serves to electrically isolate the photovoltaic element from the outside of the module. In addition, the transparent resin thin film layer 103 in combination with the transparent thermoplastic resin layer 102 serves as a filler for preventing the photovoltaic element 104 from being damaged and subjected to external shocks. The insulating layer 105 serves to reinforce the solar cell module while adding an appropriate rigidity thereto.

As for the solar cell module thus constituted, it is often configured so that it can be placed on the roof of a building or integrated with the roof of a building. In this case, it is necessary to meet the roofing standards prescribed in each country. The roofing standards sometimes include a combustion test. In order to clear the combustion test, it is desired that the amount of EVA as a combustible resin used as the filler in the solar cell module be reduced as much as possible. However, when the amount of the EVA used in the solar cell module is simply reduced, a problem ensues in that the performance of the surface covering material which protects the photovoltaic element is reduced as the amount of the EVA used is reduced.

In order to solve this problem, there is known a process wherein a transparent resin thin film layer composed of a fire-retarding or incombustible transparent resin is disposed in the surface covering material and the thickness of the EVA layer is thinned as desired, thereby attaining incombustibility of the solar cell module without reducing the performance of the surface covering material protecting the photovoltaic element. According to this process, for instance, it is possible to attain a solar cell which can be classified into Class A in the combustion test in the standard UL 1703 of the U.S.A. that prescribes a solar cell module which can be used as a roofing material.

Now, as for the above described fire-retarding or incombustible transparent resin thin film layer, it is usually formed of a resin obtained by crosslinking an acrylic resin or a fluororesin with isocyanate as a crosslinking agent. The coating composition containing isocyanate used for the formation of the fire-retarding or incombustible transparent resin thin film layer in this case includes a one liquid type coating composition in which isocyanate is previously mixed with a resin (an acrylic resin or a fluororesin) and a two-liquid type coating composition in which the two materials (that is, the isocyanate and resin) are mixed immediately before the formation of a film.

The two-liquid type coating composition is problematic in that the apparatus used for the formation of a film using the two-liquid type coating composition is unavoidably complicated because the two materials are mixed immediately before the film formation and in addition, the pot life of the resin after the admixture is liable to be short. For this reason, the one liquid type coating composition is usually used, specifically, a one-liquid type coating composition using a so-called blocking isocyanate which is used in a manner of masking a highly reactive isocyanate group by a blocking agent and dissociating the blocking agent by virtue of heat energy to regenerate the isocyanate group so as to dedicate it for the crosslinking reaction for the resin. The blocking agent used for masking the isocyanate group in this case includes MEK (methyl ethyl ketone) oxime and ε-caprolactam. In the case where MEK oxime is used, a problem is liable to ensue in that yellowing occurs when the resulting coating film is subjected to heat treatment. Therefore, in the case where a transparent film is intended to be formed, ε-caprolactam is intentionally used.

Now, in the case of a solar cell module having a surface covering material constituted by a laminate comprising such a fire-retarding or incombustible transparent resin thin film layer as above described and a transparent thermoplastic resin layer composed of EVA for example, such problems as will be described in the following are liable to occur.

That is, when the solar cell module is continuously exposed to sunlight in the outdoors over a long period of time, the temperature of the surface of the photovoltaic element may increase to 65° C. or more, whereby the surface covering material is yellowed. This problem is liable to become significant in the case where the solar cell module is used while being integrated with the roof of a building, whereby the temperature of the solar cell module is further increased. This situation occurs because the blocking agent dissociated upon the crosslinking of the resin remains in the coating film without being volatilized and reacts with a peroxide used for the crosslinking of the EVA and/or an acid generated upon the crosslinking of the EVA, thereby causing the formation of a yellowed product with reduced light transmissivity of the surface covering material, resulting in deteriorating the characteristics of the solar cell module.

In addition, when the solar cell module is continuously used in a severe outdoor atmosphere of high temperature and high humidity over a long period of time, a removal of the constituents of the surface covering material and also at the interface between the surface covering material and the photovoltaic element is liable to occur, resulting in not only deteriorating the characteristics of the solar cell module but also deteriorating the exterior appearance of the solar cell module.

In order to prevent the surface covering material from being yellowed due to heat degradation or light fatigue of the resin, the use of a primary antioxidant comprising a hindered phenol series antioxidant and a secondary antioxidant comprising a phosphorous series antioxidant in combination is known. However, the above described problems cannot be sufficiently solved by using the aforesaid two antioxidants in combination.

In view of this, there is a demand for providing an improved solar cell module which is free of the above problems.

The present invention is aimed at eliminating the foregoing problems found in the conventional surface covering material for a semiconductor element and providing an improved, highly reliable surface covering material for said semiconductor element which is free of the problems in the prior art, wherein said surface covering material excels in adhesion with the semiconductor element, is hardly yellowed and exhibits a desirable transmissivity without being deteriorated and without causing a separation between it and the semiconductor element even upon continuous exposure to a severe atmosphere with a high temperature and high humidity over a long period of time, and it enables manufacture of a highly reliable module of the semiconductor element which stably exhibits desirable module characteristics without being deteriorated even when it in continuously used under severe environmental conditions with a high humidity and with frequent changes in the environmental temperature over a long period of time.

The term "semiconductor element" in the present invention is meant to include a photoelectric conversion element, including a solar cell element.

Another object of the present invention is to provide an improved, highly reliable surface covering material comprising a specific transparent resin layer for a semiconductor element, said transparent resin layer being formed of a resin containing at least a silane coupling agent.

A further object of the present invention is to provide a highly reliable semiconductor element provided with an improved, highly reliable surface covering material comprising a specific transparent resin layer, said transparent resin layer being formed of a resin containing at least a silane coupling agent.

A further object of the present invention is to provide a highly reliable semiconductor device provided with an improved, highly reliable surface covering material comprising a specific transparent resin layer and at least a transparent organic resin layer disposed on said specific transparent resin layer, said specific transparent resin layer being formed of a resin containing at least a silane coupling agent.

According to the present invention, there are provided such advantages as will be described in the following.

(1) There can be attained a highly reliable incombustible surface coating for a solar cell module. Particularly, by reducing the amount of the combustible resin used in the surface covering resin material in the prior art, there can be attained a highly incombustible solar cell module.

(2) There can be attained a highly reliable surface coating for a solar cell module excelling in heat resistance. Particularly, there can be attained a highly reliable surface covering material comprising a coating film in which the amount of the residual blocking agent is slight and which is free of the problem found in the prior art in that the conventional surface covering material is yellowed upon continuous use under environmental conditions with a high temperature.

(3) There can be attained a highly reliable surface coating excelling in moisture resistance for a solar cell module which effectively prevents moisture invasion, wherein the solar cell module does not suffer from a reduction in its characteristics due to invaded moisture.

(4) There can be attained a highly reliable surface coat excelling in adhesion for a solar cell module. Particularly, there can be attained a highly reliable surface covering material which is free of the problem found in the prior art in that the conventional surface covering material is liable to separate from the solar cell element (or the photoelectric conversion element) upon continuous use under environmental conditions with a high temperature and high humidity, wherein the solar cell module does not suffer from a reduction in its characteristics due to such separation.

(5) There can be attained a highly reliable surface coating having an excellent electrically insulating property for a solar cell module. Particularly, there can be attained a highly reliable surface covering material which effectively prevents electric current generated by a solar cell element (or a photoelectric conversion element) from leaking to the outside and always maintains the solar cell element in a state of being electrically isolated from the exterior.

DESCRIPTION OF THE INVENTION AND PREFERRED EMBODIMENTS

Figure 1:
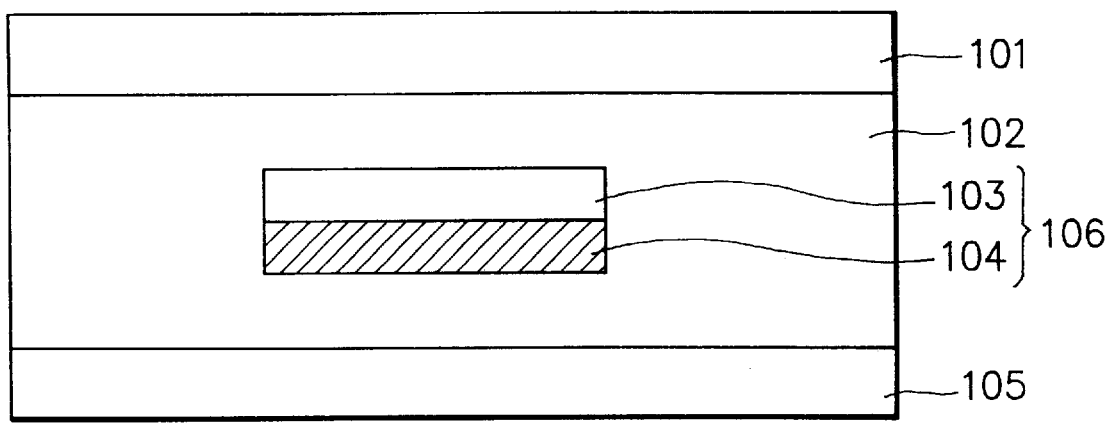
FIG. 1 is a schematic cross-sectional view illustrating the constitution of a conventional solar cell module as a semiconductor device.

The present invention intends to eliminate the foregoing problems in the prior art and to attain the above described objects.

The present invention will now be described in detail while referring to the drawings.

Figure 2:
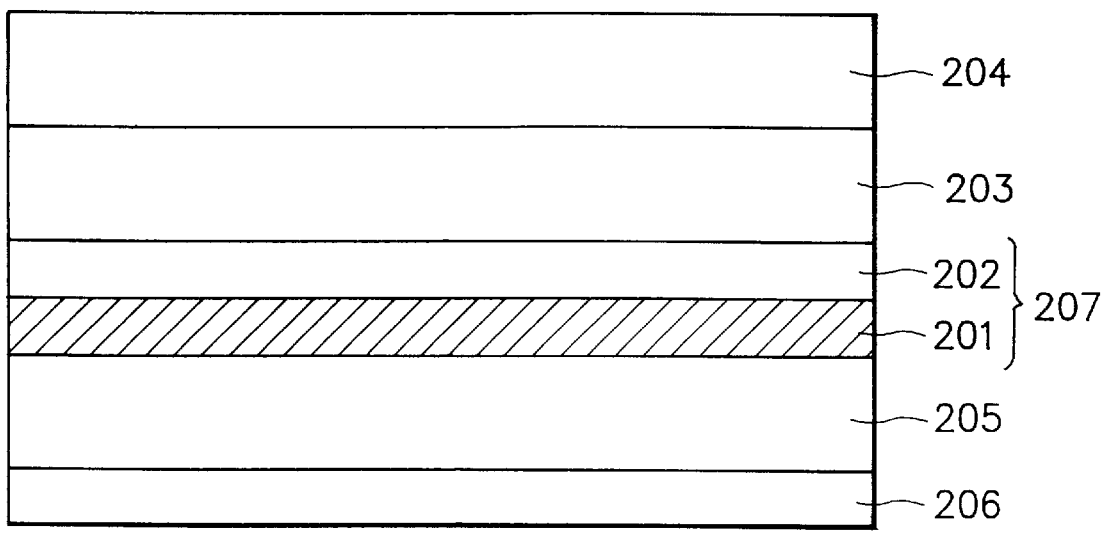
FIG. 2 is a schematic cross-sectional view illustrating the constitution of an example of a solar cell module as a semiconductor device according to the present invention.

FIG. 2 is a schematic cross-sectional view illustrating an example of a solar cell module as a semiconductor device according to the present invention.

In FIG. 2, reference numeral 201 indicates a photovoltaic element (or a photoelectric conversion element), reference numeral 202 a transparent resin layer (comprising a transparent resin thin film) reference numeral 203 a transparent front surface side filler (comprising a transparent organic high-molecular weight resin layer), reference numeral 204 a transparent film which is positioned at the outermost surface (this film will be hereinafter referred to as front surface protective film or front surface protective layer), reference numeral 205 a filler on the rear side of the photovoltaic element 201 (this filler will be hereinafter referred to as backside filler), and reference numeral 206 a back face protective film. Reference numeral 207 indicates a solar cell element comprising the photovoltaic element 201 and the transparent resin layer 202.

In the solar cell module shown in FIG. 2, light is impinged through the outermost surface film 204, and the light impinged passes through the transparent outermost surface film 204, transparent filler 203 and transparent resin layer 202 to arrive in the photovoltaic element 201. Photoelectromotive force generated in the photovoltaic element 201 is outputted through output terminals (not shown).

The photovoltaic element 201 comprises at least a semiconductor active layer as a photoelectric conversion member disposed on an electrically conductive substrate.

Figure 3:
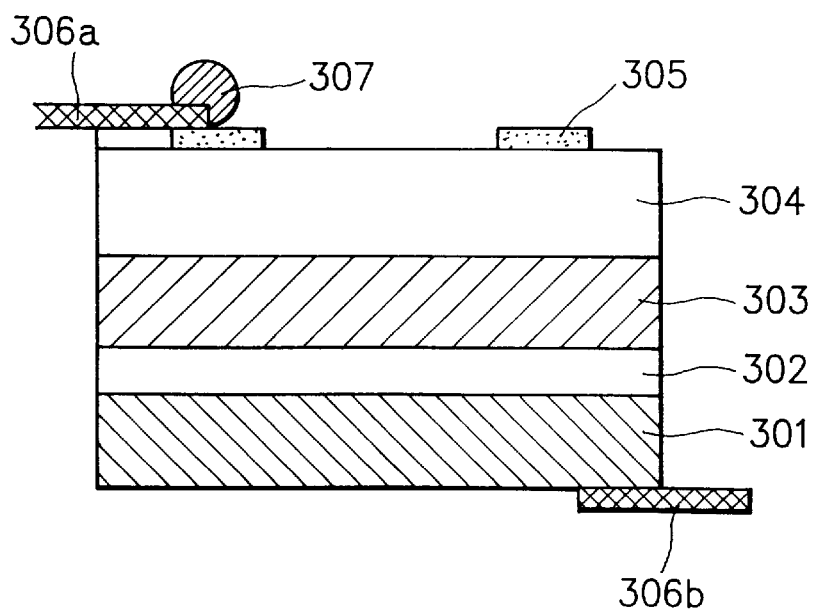
FIG. 3 is a schematic cross-sectional view illustrating the constitution of an example of a photoelectric conversion element which can be used in the present invention.

FIG. 3 is a schematic cross-sectional view illustrating the constitution of such photovoltaic element.

In FIG. 3, reference numeral 301 indicates an electrically conductive substrate, reference numeral 302 a back reflecting layer, reference numeral 303 a semiconductor active layer, reference numeral 304 a transparent and conductive layer, reference numeral 305 a collecting electrode (or a grid electrode), reference numeral 306a a power output terminal on the positive side, reference numeral 306b a power output terminal on the negative side, and reference numeral 307 an electrically connecting means.

As apparent from FIG. 3, the photovoltaic element comprises the back reflecting layer 302, the semiconductor active layer 303, the transparent and conductive layer 304, and the collecting electrode 305 disposed in this order on the electrically conductive substrate 301, wherein the output terminal 306a is electrically connected to the collecting electrode 305 by means of the electrically conductive paste or solder 307 and it extends from the collecting electrode while being insulated by means of an insulating member (not shown), and the output terminal 306b is electrically connected to the electrically conductive substrate 301 by means of solder (not shown). In this configuration, the positive side power output terminal and the negative side power output terminal may be changed into a negative side power output terminal and a positive side power output terminal depending upon the constitution of the semiconductor active layer.

The electrically conductive substrate 301 serves not only as a substrate for the photovoltaic element but also as a lower electrode. As for the electrically conductive substrate 301, there is no particular restriction as long as it has an electrically conductive surface. Specifically, it may be an electrically conductive member composed of a metal such as Ta, Mo, W, Al, Cu, Ti, or the like, or an electrically conductive member composed of an alloy such as stainless steel, or the like. Besides these, the electrically conductive substrate may comprise a carbon sheet or a Pb-plated steel sheet. Alternatively, the electrically conductive substrate may be a film or sheet made of a synthetic resin or a sheet made of a ceramic. In this case, the substrate is coated with an electrically conductive film on the surface thereof.

The back reflecting layer 302 disposed on the electroconductive substrate 301 may comprise a metal layer, a metal oxide layer, or a two-layered structure comprising a metal layer and a metal oxide layer. The metal layer may comprise a metal such as Ti, Cr, Mo, W, Al, Ag, or Ni, or an alloy of these metals. The metal oxide layer may comprise a conductive metal oxide such as ZnO, $SnO_2$, or the like.

The metal layer and metal oxide layer as the back reflecting layer 302 may be formed by means of a conventional film-forming process such as resistance heating evaporation, electron beam evaporation, or sputtering.

The back reflecting layer 302 is desired to have a roughened surface in order to effectively utilize incident light.

The semiconductor active layer 303 functions to conduct photoelectric conversion. The semiconductor active layer 303 may be composed of a non-single crystal silicon semiconductor material such as an amorphous silicon semiconductor material or polycrystalline silicon semiconductor material, or a compound semiconductor material. In any case, the semiconductor active layer comprised of any of these semiconductor materials may be of a stacked structure with a pn junction, a pin junction, or a Schottky type junction.

Specific examples of compound semiconductor materials are $CuInSe_2$, $CuInS_2$, GaAs, $CdS/CU_2S/CdTe$, CdS/InP, $CdTe/Cu_2Te$, and the like.

The semiconductor active layer comprised of any of the above mentioned semiconductor materials may be formed by a conventional film-forming process. For instance, the non-single crystal silicon semiconductor active layer may be formed by a conventional chemical vapor phase growing process such as plasma CVD or photo-induced CVD using a suitable film-forming raw material gas capable of supplying silicon atoms, such as silane gas or a conventional physical vapor phase growing process such as sputtering or the like. The semiconductor active layer composed of a polycrystalline silicon semiconductor material may be formed by a conventional polycrystalline silicon film-forming process of providing a fused silicon material and subjecting the fused silicon material to film-deposition processing or another conventional polycrystalline silicon film-forming process of subjecting an amorphous silicon material to heat treatment.

The semiconductor active layer composed of any of the above mentioned compound semiconductor materials may be formed by means of ion plating, ion beam deposition, vacuum evaporation, sputtering, or an electrolytic technique in which a deposit is formed by electrolysis of a desired electrolyte.

The transparent and conductive layer 304 functions as an upper electrode. The transparent and conductive layer may comprise $In_2O_3$, $SnO_2$, $In_2O_3$-$SnO_2$ (ITO), ZnO, $TiO_2$, or $Cd_2SnO_4$. Alternatively, it may comprise a crystalline semiconductor layer doped with an appropriate impurity at a high concentration.

The transparent and conductive layer constituted by any of the above mentioned materials may be formed by means of resistance heating evaporation, electron beam evaporation, sputtering, spraying, or CVD.

The above described impurity-doped crystalline semiconductor layer as the transparent and conductive layer may be formed by a conventional impurity-diffusion film-forming method.

Now, for a stacked body (as a photovoltaic element) 303, there may occur a condition that the electrically conductive substrate 301 and the transparent and conductive layer 304 are partially short-circuited due to an unevenness in the surface of the electrically conductive substrate and/or an unevenness in the semiconductor active layer 303 which occurs upon the formation thereof, whereby a relatively large leakage current flows in proportion to the voltage outputted, namely, there is a low leak resistance (or shunt resistance). The stacked body (the photovoltaic element) having such defects is desired to be repaired in a defect-free state by eliminating the defect. This can be conducted, for example, in accordance with the defect-repairing manner described in U.S. Pat. No. 4,729,970. In this case, the defect-bearing stacked body is desired to be repaired to have a shunt resistance preferably in the range of from 1 k$\Omega$.cm$^2$ to 500 k$\Omega$.cm$^2$ or more preferably in the range of from 10 k$\Omega$cm$^2$ to 500 k$\Omega$.cm$^2$.

For the purpose of efficiently collecting an electric current generated by the photoelectromotive force, the collecting electrode (or the grid electrode) 305 may be disposed on the transparent and conductive layer 304. The collecting electrode 305 may be in the form of a stripe shape or comb shape.

The collecting electrode 305 may comprise a metal such as Ti, Cr, Mo, W, Al, Ag, Ni, Cu, or Sn, or an alloy of these metals. Alternatively, the collecting electrode may be formed of an electrically conductive paste or an electrically conductive resin. The electrically conductive paste can include electrically conductive pastes comprising powdered Ag, Au, Cu, Ni, or carbon dispersed in an appropriate binder resin. The binder resin herein can include polyester, epoxy resin, acrylic resin, alkyd resin, polyvinyl acetate, rubber, urethane resin, and phenol resin.

The collecting electrode 305 may be formed by means of sputtering using a patterned mask, resistance heating evaporation, or CVD. It may also be formed by depositing a metal film over the entire surface and subjecting the metal film to an etching treatment to form a desired pattern, by directly forming a grid electrode pattern by means of photo-induced CVD, or by forming a negative pattern corresponding to a grid electrode pattern and subjecting the resultant to plating treatment.

The formation of the collecting electrode using any of the above described electrically conductive pastes can be conducted by subjecting the electrically conductive paste to screen printing or fixing a metal wire to the screen-printed electrically conductive paste, if necessary, using a solder.

The output terminals 306a and 306b serve to output electromotive force. The output terminal 306a is electrically connected to the collecting electrode 305 by means of the electrically connecting means 307 comprising an electrically conductive paste or a solder. The output terminal 306b is electrically connected to the electrically conductive substrate 301 by spot welding or soldering an appropriate metal body such as copper tab.

In general, there are provided a plurality of photovoltaic elements having the above constitution, and they are integrated in series connection or in parallel connection depending upon the desired voltage or current. It is possible to dispose the integrated body on an insulating member such that a desired voltage or electric current can be obtained.

Description will now be made of the surface protective film 204 (or the surface protective layer).

The surface protective film 204 is positioned at the outermost surface of the solar cell module and because of this, it is required to excel in transparency, weatherability, water repellency, heat resistance, pollution resistance, and physical strength. In addition, in the case where the solar cell module is used outdoors, it is required that the surface protective film ensure that the solar cell module is of sufficient durability upon repeated use over a long period of time.

In order for the surface protective film to satisfy all these conditions, the surface protective film comprises a film composed of a highly transparent fluororesin. Specific examples of such highly transparent fluororesin are tetrafluoroethylene-ethylene copolymer (ETFE), polyvinyl fluoride resin (PVF), polyvinylidene fluoride resin (PVDF), polytetrafluoroethylene resin (TFE), tetrafluoroethylene-hexafluoropropylene copolymer (FEP), and polychlorotrifluoroethylene resin (CTFE). Of these fluororesins, PVF is most excellent in view of weatherability. And in view of weatherability and physical strength in combination, ETFE is most excellent.

In order to attain an improvement in the adhesion of the surface protective film 204 with the surface side filler 203, a given surface of the surface protective film to be contacted with the surface side filler is subjected to surface treatment upon its lamination to the surface side filler. The surface treatment in this case can include corona discharging treatment and plasma treatment. In order for the surface protective film to have an improved physical strength, it is desired that the surface protective film comprises ah oriented film. Further, in order to attain an improvement in the weatherability of the surface protective layer, it is possible to make the surface protective film such that it has an outermost surface coated with $SiO_x$.

Description will now be made of the front surface side filler 203 (the transparent organic high-molecular resin layer).

The front surface side filler 203 serves to cover the photovoltaic element with a resin so as to protect it from the external environment. In addition, the front surface side filler serves to bond the front surface protective film with the photovoltaic element. Hence, the front surface side filler is required to be highly transparent, and to excel in weatherability, adhesion, and heat resistance. In order for the front surface side filler to meet these conditions, the front surface side filler is desired to comprise a thermoplastic resin selected from the group consisting of polyolefinic resins, butyral resins, silicone resins, epoxy resins, and acrylic resins.

Preferable specific examples of such thermoplastic resin are ethylene-vinyl acetate copolymer (EVA), ethylene-methyl acrylate copolymer (EMA), ethylene-ethyl acrylate copolymer (EEA), ethylene-butyl acrylate copolymer (EBA), ethylene-methyl methacrylate copolymer (EMM), ethylene-ethyl methacrylate copolymer (EEM), and polyvinyl butyral (PVB). Of these resins, EVA and EEA are the most appropriate in view of availability and from an economical viewpoint.

Any of the above mentioned resins usable as the front surface side filler (this resin will be hereinafter referred to as filler resin) has a low heat deformation temperature and is liable to readily deform or creep at a high temperature. Because of this, the filler resin is desired to be crosslinked with an appropriate crosslinking agent so that it has an increased heat resistance and adhesion property. The crosslinking agent usable in this case can include isocyanates, melamines, and organic peroxides. In any case, the crosslinking agent is desired to be one which has a sufficiently long pot life and quickly causes crosslinking of the filler resin. Further, since the front surface protective film is laminated on the front surface side filler, it is desired for the crosslinking agent to be one that causes no or only a slight amount of free material from the crosslinking agent to remain.

In addition, the front surface side filler may contain an antioxidant in order to prevent it from being thermally oxidized. Further in addition, in order to prevent the front surface side filler from being deteriorated by light impingement, the front surface side filler may contain an UV absorber and/or a light stabilizer.

In the case where the adhesion of the front surface side filler with the photovoltaic element or the surface protective film is not sufficient, the adhesion can be improved by incorporating into the front surface side filler a silane coupling agent and a titanate coupling agent either singly or in combination.

Description will now be made of the transparent resin thin film layer 202 (or the transparent resin layer).

The transparent resin thin film layer 202 serves to coat the irregularities of the photovoltaic element while protecting the photovoltaic element from the external environment in combination with the front surface side filler. The transparent resin thin film layer 202 also serves to maintain the photovoltaic element electrically isolated from the exterior. As well as in the case of the front surface side filler 203, the transparent resin thin film 202 is required to be highly transparent, and to excel in weatherability, adhesion, and heat resistance.

In order for the transparent resin thin film layer 202 to meet these conditions, the transparent resin thin film layer is mainly comprised of a transparent resin selected from the group consisting of resins comprising acrylic resins, silicone resins, or fluororesins. Preferable specific examples of such resin are resins obtained by crosslinking an acrylic resin and an inorganic polymer with an appropriate crosslinking agent, silicone series resins such as alkoxysilazanes, and fluororesins.

The above acrylic resin can include resins obtained by polymerizing a methacrylic monomer selected from the group consisting of methyl methacrylate, ethyl methacrylate, propyl methacrylate, butyl methacrylate, methacrylic acid, diethylaminoethyl methacrylate, 2-hydroxyethyl methacrylate, tert-butylaminoethyl methacrylate, 2-hydroxypropyl methacrylate, dimethylaminoethyl methacrylate, ethylene dimethacrylate, ethylene glycol dimethacrylate, and 1,3-butylene dimethacrylate, and a monomer selected from the group consisting of isobutyl acrylate, acrylic acid diethyleneglycolethoxylate, 2-hydroxyethyl acrylate, and 2-hydroxypropylacrylate.

The above inorganic polymer can include polymers of silicon compounds such as siloxane, silazane, metallosiloxane, metallosilazane, and mixtures of these polymers.

As the crosslinking agent used for crosslinking the acrylic resin and inorganic polymer, it is desired to use a crosslinking agent which has a sufficiently long pot life and which quickly causes crosslinking reaction between the acrylic polymer and inorganic polymer to produce a crosslinked resin in a state containing no free material from the crosslinking agent or only a slight amount of said free material if it should be contained therein.

There can be mentioned blocking isocyanates as crosslinking agents which meet these conditions.

In terms of chemical structure of the isocyanate monomer for such blocking isocyanate, there can be mentioned tolylenediisocyanate, isophoronediisocyanate (IPDI), xylenediisocyanate (XDI), 1,3-bis(isocyanatomethyl) cyclohexane ($H_6XDI$), hexamethylenediisocyanate (HDI), tetramethylxylylenediisocyanate, and m-isopropenyl-α,α-dimethylbenzylisocyanate.

In the case where an excellent transparency is required, XDI which is of yellowing retardant type, and IPDI, $H_6XDI$, and HDI which are of non-yellowing type are desired to be used.

The above mentioned isocyanate monomers are generally used as an isocyanate prepolymer. And they are roughly divided into adduct series of tetramethylene propanol (TMP) (or TMP adducts in other words), biuret series, isocyanurate series and alphanate series. In order for the transparent resin thin film layer to have an improved weatherability and heat resistance, a TMP adduct or isocyanurate is desired to be used.

As the blocking agent for the isocyanate, there can be mentioned oximes such as ethylacetoacetate and methyl ethyl ketone (MEK) oxime, lactams such as ε-caprolactam, phenols, and alcohols. In order to prevent a resin thin film as the transparent resin thin film layer from being yellowed upon the formation thereof or upon use under high temperature conditions, it is desired to use ε-caprolactam or alcohols.

In order to make a resin thin film used as the transparent resin thin film layer to be desirably heat resistant when used under conditions of high temperature, the resin thin film may contain an antioxidant in an amount of 0.05 to 1.0 wt. % versus the total amount of the resin components of the resin film.

Such antioxidant can include monophenol series antioxidants, bisphenol series antioxidants, high-molecular phenol series antioxidants, sulphur series antioxidants, and phosphorous series antioxidant Specific examples of the monophenol series antioxidants are 2,6-di-tert-butyl-p-cresol, butylated hydroxyanisol, and 2,6-di-tert-butyl-4-ethylphenol.

Specific examples of the bisphenol series antioxidants are 2,2'-methylene-bis-(4-methyl-6-tert-butylphenol), 2,2'-methylene-bis-(4-ethyl-6-tert-butylphenol), 4,4'-thiobis-(3-methyl-6-tert-butylphenol), 4,4'-butylidene-bis-(3-methyl-6-tert-butylphenol), and 3,9-[1,1-dimethyl-2-{β-(3-tert-butyl-4-hydroxy-5-methyl phenyl)propyonyloxy ethyl}2,4,8,10-tetraoxapyro] 5,5 undecane.

Specific examples of the high-molecular phenol series antioxidants are 1,1,3-tris-(2-methyl-4-hydroxy-5-tert-butylphenyl)butane, 1,3,5-trimethyl-2,4,6-tris (3,5-di-tert-butyl-4-hydroxybenzyl)benzene, tetrakis-methylene-3-(3', 5'-di-tert-butyl-4'-hydroxyphenyl) propionate methane, bis 3,3'-bis-(4'-hydroxy-3'tert-butylphenyl)butyric acid glucoseester, 1,3,5-tris(3',5'-di-tert-butyl-4'-hydoxylbenzyl)-s-triazine-2,4,6-(1H,3H,5H)trion, and tocopherol (Vitamin E).

Specific examples of the sulphur series antioxidants are dilaurylthiodipropionate, dimyristylthlodipropionate, and distearylthiopropionate.

Specific examples of the phosphorous series antioxidants are triphenylphosphate, diphenylisodecylphosphate, phenyldiisodecylphosphate, 4,4'-butylidene-bis-(3-methyl-6-tert-butylphenyl-di-tridecyl)phosphate, cyclicneopentanetetrabis (octadecylphosphate), tris(mono or di)phenylphosphate, diisodecylpentaerythritoldiphosphate, 9,10-dihydro-9-oxa-10-phosphenanthrene-10-oxide, 10-(3,5-di-tert-butyl-4 -hydroxybenzyl)-9,10-dihydro-9-oxa-10phosphenanthrene-10-oxide, 10-decyloxy-9,10-dihydro-9-oxa-10-phosphenanthrene, cyclicneopentanetetrabis(2,4-di-tert-butylphenyl)phosphate, cyclicneopentanetetrabis (2,6-di-tert-methylphenyl)phosphate, and 2,2-methylenebis (4,6-tert-butylphenyl)octylphosphate.

These antioxidants may be used either singly or in a combination of two or more of them.

Further, in order for the resin thin film as the transparent resin thin film layer to have an improved adhesion, the resin film may contain a silane coupling agent in an amount of 0.1 to 10 wt. % versus the total amount of the resin components of the resin film.

Such silane coupling agent in terms of chemical structure can include compounds represented by the general formula $XSiY_3$, with X being a reactive organic functional group and Y being a hydrolyzable group. The reactive organic functional group X can include an amino group, γ-glycidoxypropyl group, vinyl group, methacryl group, mercapto group, and chlorine group. The hydrolyzable group Y can include alkoxy groups such as a methoxy group and an ethoxy group. Of these groups, the γ-glycidoxypropyl group is the most appropriate as the group X, and the methoxy group is the most appropriate as the group Y.

Specific examples of these compounds are
γ-(2-aminoethyl)aminopropyltrimethoxysilane,
γ-(2-aminoethyl)aminopropyldimethoxysilane,
γ-methacryloxypropyltrimethoxysilane,
γ-(2-aminoethyl)aminopropyltrimethoxysilane,
γ-glycidoxypropyltrimethoxysilane,
γ-mercaptopropyltrimethoxysilane, vinyltrimethoxysilane, hexamethyldisilazane,
γ-allynynopropyltrimethoxysilane, and β-(3,4-epoxycyclohexyl)ethyltrimethoxysilane.

Specifically, epoxy series silane coupling agents such as γ-glycidoxypropyltrimethoxysilane, γ-glycidoxypropyltriethoxysilane, and β-(3,4-epoxycyclohexyl)ethyltrimethoxysilane are desirably used. Of these, γ-glycidoxypropyltrimethoxysilane is the most desirable since if it used as the silane coupling agent, an improvement can be attained not only in the adhesion but also in the heat resistance of the resin thin film as the transparent resin thin film layer.

Further, the resin thin film as the transparent resin thin film layer may contain fine particles of an appropriate inorganic oxide (this will be hereinafter referred to as inorganic oxide fine particles).

Specific examples of such inorganic oxide are silicon oxide, zinc oxide, tin oxide, titanium oxide, and aluminum oxide.

The added inorganic oxide fine particles are of a mean particle size preferably in the range of from 1 μm to 1000 μm or more preferably in the range of from 5 μm to 100 μm.

As for the amount of the inorganic oxide fine particles to be added, when it is excessive, a problem is liable to entail in that light does not sufficiently arrive at the photovoltaic element. It is preferably in the range of from 0.1 wt. % to 20 wt. % or more preferably in the range of from 0.2 wt. % to 10 wt. %.

The incorporation of the inorganic oxide fine particles in a desired amount within the above range into the transparent resin thin film layer provides advantages such that incident light is desirably scattered to improve the photoelectric conversion efficiency, and the hardness of the transparent resin thin film layer is increased and as a result, the performance of the transparent resin thin film layer as the protective layer for the photovoltaic element is improved, wherein particularly, the weatherability of the transparent resin thin film layer is improved.

The incorporation of the inorganic oxide fine particles into the transparent resin thin film layer may be conducted by adding fine particles of any of the foregoing inorganic oxides to a given resin used for the formation of the transparent resin thin film layer or by forming a resin thin film as the transparent resin thin film layer and spraying fine particles of any of the foregoing inorganic oxides onto the resin thin film.

Description will now be made of the backside filler 205 disposed on the rear side of the photovoltaic element 201.

The backside filler 205 serves to provide sufficient adhesion between the photovoltaic element 201 and the back face protective film 206. The backside filler 205 is desired to comprise a material capable of ensuring sufficient adhesion between the electrically conductive substrate of the photovoltaic element and the back face protective film and which excels in durability, withstands thermal expansion and thermal contraction, and excels in flexibility. Specific examples of such material are hot-melt materials such as EVA (ethylene-vinyl acetate copolymer), polyvinyl butyral, and epoxy adhesives. Besides these, double-coated tapes may be also usable.

Alternatively, the backside filler 205 may comprise the same resin material used for the front surface side filler 203.

When the solar cell module is one which is used under environmental conditions of a high temperature, for instance, when integrated to a roof of a building in order to use it outdoors, it is desired to use as the backside filler a material capable of being crosslinked in order to attain a further improved adhesion between the electrically conductive substrate of the photovoltaic element and the back face protective film so that the solar cell module can endure repeated use at high temperature. Incidentally, resin materials such as EVA can be desirably crosslinked with the use of an organic peroxide.

Description will now be made of the back face protective film 206.

The back face protective film 206 is disposed for the purpose of electrically isolating the electrically conductive substrate of the photovoltaic element 201 from the outside. The back face protective film 206 is desired to be composed of a material which can sufficiently electrically isolate the electrically conductive substrate of the photovoltaic element, excels in durability, withstands thermal expansion and thermal contraction, and excels in flexibility. Specific examples of such material are laminated films comprising a nylon film or a PET (polyethylene terephthalate) film, having an adhesive layer composed of a polyolefin resin on both faces. The polyolefin resin can include ethylene-vinyl acetate copolymer (EVA), ethylene-methyl acrylate copolymer (EMA), and ethylene-ethyl acrylate copolymer (EEA).

In the present invention, it is possible to dispose a back face reinforcing member (not shown in the figure) outside the back face protective film 206 in order to improve the mechanical strength of the solar cell module and in order to prevent the solar cell module from being distorted or warped due to changes in the environmental temperature. The back face reinforcing member may comprise a steel plate, a plastic plate, or a fiber-glass reinforced plastic plate (a so-called FRP plate).

Now, in order to prevent a decrease in the quantity of incident light arriving in the photovoltaic element, the surface covering material comprising the transparent resin thin film layer 202, the transparent front surface side filler 203 and the front surface protective film 204 which are stacked in the named order from the photovoltaic element side, is desired to be substantially transparent.

Specifically, it is desired for the surface covering material to have a transmittance in a visible light wavelength region of 400 nm to 800 nm of preferably 80% or more preferably 90% or more. Further, in order to facilitate external light entrance into the photovoltaic element, the front surface covering material is made such that it has a refractive index of preferably 1.1 to 2.0, more preferably 1.1 to 1.6 at a temperature of 25° C.

In the following, description will be made of a manner of producing a solar cell module as a semiconductor device according to the present invention using the foregoing photovoltaic element (or photoelectric conversion element), transparent resin thin film layer, filler resin, front surface protective film, and back face protective material.

Coating of the light receiving face of the photovoltaic element by the transparent resin thin film layer may be conducted by applying a coating liquid comprising a given resin for the formation of the transparent resin thin film layer dissolved in a solvent. The application of the coating liquid onto the light receiving face of the photovoltaic element may be conducted by dipping the photovoltaic element in the coating liquid to form a coating film covering the light receiving face of the photovoltaic element; by air-spraying the coating liquid in an atomized state over the light receiving face of the photovoltaic element to form a coating film covering the light receiving face of the photovoltaic element; or by air-spraying the coating liquid in the liquid state over the light receiving face of the photovoltaic element to form a coating film covering the light receiving face of the photovoltaic element. In any case, the coating film formed on the photovoltaic element is subjected to crosslinking treatment while evaporating the solvent or after the solvent has been vaporized. Besides these methods, the formation of the transparent resin thin film layer on the photovoltaic element may be conducted by providing a given resin in a powdered form for the formation of the transparent resin thin film layer, depositing the powdered resin on the light receiving face of the photovoltaic element by electrostatic adsorption to form a coating film of covering the light receiving face of the photovoltaic element, and subjecting the coating film to heat treatment to crosslink it.

Coating of the light receiving face of the photovoltaic element (particularly, the light receiving face of the solar cell element 207 (see, FIG. 2)) by the front surface side filler may be conducted by (a) applying a coating liquid comprising a filler resin material dissolved in a solvent onto the light receiving face and vaporizing the solvent of the applied coating liquid; (b) by uniformly depositing a powdered filler resin material on the light receiving face and subjecting the deposited powdered filler resin material to heat fusion; (c) by providing a heat-fused product of a filler resin material and applying the heat-fused product onto the light receiving face through a slit; or (d) by obtaining a sheet of a filler resin material using a heat-fused product of the filler resin material and laminating the sheet on the light receiving face by way of thermocompression bonding.

In the case of the above manner (a), if necessary, one or more of desired additives such as a silane coupling agent, UV absorber, antioxidant and the like are firstly mixed with the solvent prior to dissolving the filler resin material therein, and the resultant coating liquid is applied onto the light receiving face of the photovoltaic element, followed by drying.

Similarly, in any of the remaining methods (b) to (d), in the case of using one or more of said desired additives, such additive is added to the filler resin material prior to heat-fusing the filler resin material.

In the case where the front surface side filler 203 has been previously formed on the light receiving face of the solar cell element 207 (see, FIG. 2), the surface protective film 204 is laminated on the front surface side filler and the back side filler resin material 205 and the back face protective film 206 are laminated on the rear face of the solar cell element to obtain a composite, and the resultant composite is subjected to thermocompression bonding, whereby a desirable solar cell module can be obtained. In the case where the back face reinforcing member is intended to be disposed, it is possible for the back face reinforcing member to be laminated to the back face protective film by means of an appropriate adhesive. The lamination of the back face reinforcing member may be conducted after utilizing the above thermocompression bonding or it may be independently conducted after the above thermocompression bonding.

Alternatively, a sheet composed of a filler resin material for the front surface side filler may be used instead of the front surface side filler previously formed on the light receiving face of the solar cell element in the above procedures. In this case, the sheet is interposed between the front surface protective film and the solar cell element to obtain a composite, and the resultant composite is subjected to thermocompression bonding, whereby a desirable solar cell module can be obtained.

The thermocompression bonding can include vacuum lamination and roll lamination.

In the following, the present invention will be described in more detail with reference to examples which are not intended to restrict the scope of the present invention.

EXAMPLE 1

1. Preparation of photoelectric conversion element (solar cell)

There were prepared a plurality of solar cells each having the configuration shown in FIG. 3 and which had a semiconductor active layer composed of an amorphous silicon (a-Si) material (this solar cell will be hereinafter referred to as a-Si solar cell) in the following manner.

That is, there was firstly provided a well-cleaned stainless steel plate as the substrate 301. On the substrate 301, there was formed a two-layered back reflecting layer 302 comprising a 500 nm thick Al film and a 500 nm thick ZnO film by means of a conventional sputtering process, followed by forming, on the back reflecting layer 302, a tandem type a-Si photoelectric conversion semiconductor layer 303 with an nip/nip structure comprising a 15 nm thick n-type layer/a 400 nm thick i-type layer/a 10 nm thick p-type layer/a 10 nm thick n-type layer/a 80 nm thick i-type layer/a 10 nm thick p-type layer being laminated in the named order from the substrate side by means of a conventional plasma CVD manner, wherein an n-type a-Si film as each n-type layer was formed from a mixture of $SiH_4$ gas, $PH_3$ gas, and $H_2$ gas; an i-type a-Si film as each i-type layer was formed from a mixture of $SiH_4$ gas and $H_2$ gas; and a p-type μc-Si film as each p-type layer was formed from a mixture of $SiH_4$ gas, $BF_3$ gas, and $H_2$ gas. Then, on the semiconductor active layer 303, there was formed a 70 nm thick transparent and conductive layer 304 composed of $In_2O_3$ by means of the conventional heat resistance evaporation process wherein an In-source was evaporated in an $O_2$ atmosphere. Thus, there was obtained a photovoltaic element.

The resultant photovoltaic element was found to have a shunt resistance of 1 $k\Omega \cdot cm^2$ to 10 $k\Omega \cdot cm^2$. Therefore, the photovoltaic element was subjected to defect-repairing treatment in the following manner. That is, the photovoltaic element and an electrode plate were immersed in an aqueous solution of aluminum chloride adjusted to have an electric conductivity of 50 to 70 mS such that the electrode plate was opposed to the transparent and conductive layer of the photovoltaic element, and wherein the photovoltaic element was electrically grounded. Then, a positive electric potential of 3.5 V was impressed on the electrode plate for 2 seconds, whereby the transparent and conductive layer situated at shunted (or short-circuited) portions in the photovoltaic element was selectively decomposed. The photovoltaic element thus repaired was found to have a shunt resistance of 50 $k\Omega \cdot cm^2$ to 200 $k\Omega \cdot cm^2$.

Successively, a grid electrode as the collecting electrode 305 was formed on the transparent and conductive layer 304 in the following manner. That is, on the transparent and conductive layer, there was formed a Cu-paste line with a width of 200 um by means of screen printing. Then, a copper wire of 100 um diameter was wired on and along the Cu-paste line, a cream solder was disposed thereon, followed by fusing the solder to thereby fix the copper wire onto the Cu-paste. A grid electrode was thus formed on the transparent and conductive layer.

As for the resultant, a copper tab as the negative side power output terminal 306b was fixed to the substrate 301 using a stainless solder, and a tin foil tape as the positive side power output terminal 306a was fixed to the grid electrode as the collecting electrode 305 using solder. Thus, there was obtained an a-Si solar cell. In this way, there were obtained a plurality of a-Si solar cells.

2. Preparation of module

Using each of the a-Si solar cells obtained above, there were prepared in the following manner a plurality of solar cell modules each having the configuration shown in FIG. 4.

Figure 4:
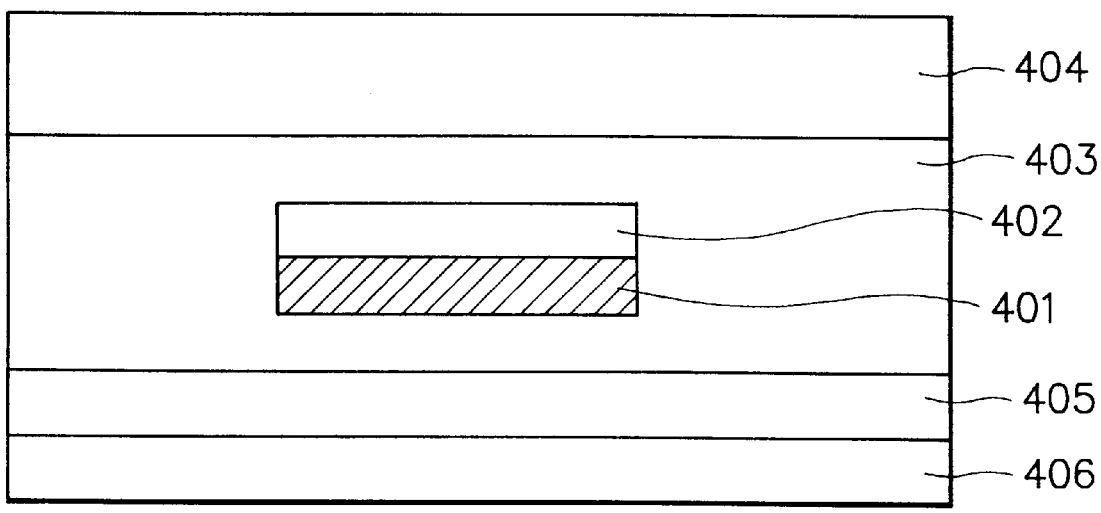
FIG. 4 is a schematic cross-sectional view illustrating the constitution of another example of a solar cell module as a semiconductor device according to the present invention.

In FIG. 4, reference numeral 401 indicates a photoelectric conversion element (corresponding to the foregoing a-Si solar cell in this case), reference numeral 402 a transparent resin thin film layer disposed on the photoelectric conversion element 401 so as to cover the light receiving surface thereof, reference numeral 403 a filler (comprising a transparent organic high-molecular resin layer) which encloses a laminate of the photoelectric conversion element 401 and the transparent resin thin film layer 402, reference numeral 404 a front surface protective film disposed on the filler 403, reference numeral 405 a back face protective film disposed under the filler 403, and reference numeral 406 a back face reinforcing member disposed under the back face protective film. The filler 403 includes a front surface side filler and a backside filler.

(1) Preparation of a laminate comprising a transparent thin film layer 402 formed on a photoelectric conversion element 401 (that is, the a-Si solar cell obtained in the above) so as to cover the light receiving face:

100 parts by weight of a resin mixture composed of an acrylic resin, an inorganic polymer, and hexamethylenediisocyanate blocked by ∈-caplolactam and 2.8 parts by weight of γ-methacryloxypropyltrimethoxysilane as a silane coupling agent to obtain a mixture. The mixture was applied onto the light receiving face of the a-Si solar cell by means of the conventional coating process to form a coating film, followed by subjecting the coating film to heat treatment to vaporize the solvent while crosslinking the resin of the coating film, to thereby form a transparent resin thin film as the transparent resin thin film layer 402 on the a-Si solar cell 401 so as to cover the light receiving face thereof. By this, there was obtained a laminate comprising the a-Si solar cell and the transparent thin film layer.

(2) Provision of a filler material as the filler 403:

(a) As the front surface side filler, there was provided a 460 μm thick EVA sheet obtained by mixing 100 parts by weight of EVA (ethylene-vinyl acetate copolymer), 3 parts by weight of 2,5-dimethyl-2,5-bis(t-butylperoxy)hexane as a crosslinking agent, 1.0 part by weight of γ-methacryloxypropyltrimethoxysilane as a silane coupling agent, 0.3 part by weight of 2-hydroxy-4-n-octoxybenzophenone as a UV absorber, 0.1 part by weight of bis(2,2,6,6-tetramethyl-4piperidyl)sebacate as a light stabilizer, and 0.2 part by weight of tris (mono-nonylphenyl)phosphate as an antioxidant to obtain a mixture, heating the mixture to obtain a fused product, and subjecting the fused product to extrusion molding using a T-die wherein the fused product was extruded through the slit of the T-die.

(b) As a backside filler, there was provided a 460 μm thick EVA film.

(3) Provision of a film as the front surface protective film 404:

As the surface protective film 404, there was provided a 38 um thick stretched ETFE film having a surface which is to be contacted with the surface of the filler 403 treated by way of corona discharging (the front surface side filler).

(4) Provision of a film as the back face protective film 405:

As the back face protective film 405, there was provided a laminated film comprising an EEA (ethylene-ethyl acrylate copolymer) film of 200 um in thickness/a polyethylene film of 25 um in thickness/a PET (polyethylene terephthalate) film of 50 um in thickness/ an EEA (ethylene-ethyl acrylate copolymer) film of 200 um in thickness.

(5) Provision of the back face reinforcing member 406:

As the back face reinforcing member 406, there was provided a 0.3 mm thick galvalume steel member (or a Zn-coated steel member).

(6) Preparation of a solar cell module:

On the light receiving face of the laminate (that is, on the surface of the transparent resin thin film layer 402 disposed on the a-Si solar cell) obtained in the above (1), there were laminated the EVA sheet (obtained in the above (2)-(a)) and the ETFE film (provided in the above (3)) in the named order. In this case, the corona-discharged surface of the ETFE film contacted the surface of the EVA sheet. On the rear face of the resultant, there were laminated the EVA film (provided in the above (2)-(b)), the laminated film (provided in the above (4)) and the galvalume steel member (provided in the above (5)) in the named order. Thus, there was obtained a stacked body. The stacked body thus obtained was placed in a vacuum laminator, wherein it was subjected to heat treatment at 150° C. for 30 minutes while evacuating the inside of the vacuum vessel to a predetermined vacuum, followed by cooling to room temperature. Thus, there was obtained a solar cell module.

In this way, there were prepared a plurality of solar cell modules.

Evaluation

Using the resultant solar cell modules, evaluation was conducted with respect to combustibility, heat resistance, adhesion, endurance against changes in environmental temperature, weatherability, electrical insulation, and resistance to scratching.

The obtained evaluation results are collectively shown in Table 1.

The evaluation of each of the above evaluation items was conducted in the following manner:

(1) Evaluation of the combustibility:

The solar cell module was placed on a deck slanted at 22° against the horizon. A gas burner flame of 760±28° C. was supplied to the surface covering material side of the solar cell module for 10 minutes, and the flame spreading was observed. The observed results are shown in Table 1 based on the following criteria:

○: the flame spreading is less than 6 feet from the tip, and

X: the flame spreading is beyond 6 feet from the tip.

(2) Evaluation of the heat resistance:

The solar cell module was exposed to an atmosphere of 150° C. for 15 hours, and thereafter, change in the initial transmittance of its surface covering material of light of 400 nm wavelength was observed. The observed results are shown in Table 1 based on the following criteria:

○: a case where no yellowing occurred (the change in the initial transmittance is less than 10%), and X: a case where yellowing occurred (the change in the initial transmittance is greater than 10%).

(3) Evaluation of the adhesion:

As for the solar cell module, in accordance with JIS K5400 8.5.2, the adhesion between the transparent resin thin film layer and the transparent and conductive layer was examined. The observed results are shown in Table 1 based on the following criteria:

○: no separation occurred, and

X: separation occurred.

(4) Evaluation of the endurance against changes in environmental temperature:

The solar cell module was subjected to 20 repetitions of a cycle of exposure to an atmosphere of −40° C. for an hour and exposure to an atmosphere of 85° C./85% RH for an hour, and thereafter, its exterior appearance was optically observed. The observed results are shown in Table 1 based on the following criteria:

⊚: no change is observed in the exterior appearance,

○: slight change is observed in the exterior appearance but it is not problematic in practice, and X: problematic, discernible removal and/or cracking and coloring which are not acceptable in practice are observed in the exterior appearance.

(5) Evaluation of the weatherability:

The solar cell module was placed in a carbon-arc sunshine weather meter, wherein it was irradiated with pseudo sunlight for 5000 hours under conditions of repeating a cycle of maintaining at a black panel temperature of 63° C. for 108 minutes and a pure water fall for 12 minutes. Thereafter, its exterior appearance was optically observed. The observed result is shown in Table 1 based on the following criteria:

⊚: no change is observed in the exterior appearance,

◯: a slight change is observed in the exterior appearance but it is not problematic in practice, and X: problematic, discernible removal and/or cracking and coloring which are not acceptable in practice are observed in the exterior appearance.

(6) Evaluation of the electrical insulation:

The positive and negative output terminals of the solar cell module were intentionally short-circuited. A high-potential tester was electrically connected between the short-circuited terminal and the back face reinforcing member and 2200 DC voltage was impressed, wherein the leakage current was measured. The measured results are shown in Table 1 based on the following criteria:

◯: the leakage current to 50 $\mu$A or less (acceptable), and

X: the leakage current is above 50 $\mu$A (not acceptable).

Figure 5:
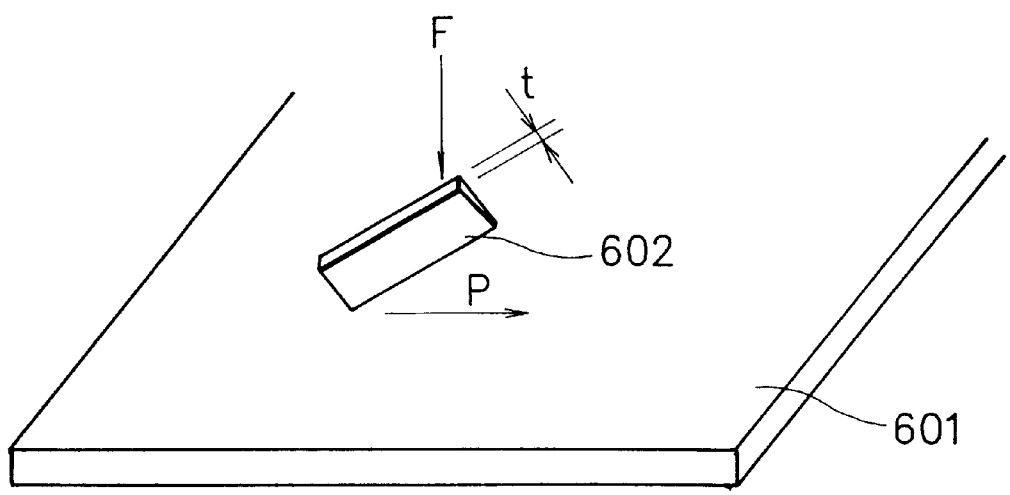
FIG. 5 is a schematic view for explaining the scratch resistance test which will be later described.

(7) Evaluation of the scratch resistance:

This evaluation was conducted in the following manner. That is, the solar cell module was subjected to surface treatment in a manner shown in FIG. 5, wherein a 1 mm thick metal plate 602 is contacted via a corner thereof to the most recessed portion of the light receiving surface side 601 of the solar cell module. Then, a load F of 2 pounds is applied to the metal plate and a load F of 5 pounds is applied without moving the metal plate. Then the metal plate is pulled in a direction indicated by an arrow P while applying the latter load thereto to form a scratch. Then the solar cell module thus treated is evaluated for whether or not the scratched portion of the surface covering material still provides electrical isolation from the outside. This evaluation is conducted by immersing the treated solar cell module in an electrolytic solution of 3000 $\Omega$cm, and applying a voltage of 2200 V between the photovoltaic element of the solar cell module and the electrolytic solution and measuring the leakage current. The observed results are shown in Table 1 based on the following criteria,:

◯: the leakage current is 50 $\mu$A or less (acceptable), and

X : the leakage current is above 50 $\mu$A (not acceptable).

EXAMPLE 2

The procedures of Example 1 were repeated, except that the isocyanate monomer used in the formation of the transparent resin thin film layer in Example 1 was replaced by 1,3-bis(isocyanatomethyl)cyclohexane.

Using the resultant solar cell modules, evaluation was conducted in the same manner as in Example 1.

The results obtained are collectively shown in Table 1.

EXAMPLE 3

The procedures of Example 1 were repeated, except that the EVA used as the front surface side filler in Example 1 was replaced by EEA (ethylene-ethyl acrylate copolymer).

Using the resultant solar cell modules, evaluation was conducted in the same manner as in Example 1.

The results obtained are collectively shown in Table 1.

EXAMPLE 4

The procedures of Example 1 were repeated, except that the silane coupling agent used in the formation of the transparent resin thin film layer in Example 1 was replaced by γ-methacryloxypropyltrimethoxysilane.

Using the resultant solar cell modules, evaluation was conducted in the same manner as in Example 1.

The results obtained are collectively shown in Table 1.

EXAMPLE 5

The procedures of Example 1 were repeated, except that the ε-caprolactam used as the blocking agent for the isocyanate monomer in the formation of the transparent resin thin film layer in Example 1 was replaced by methyl ethyl ketone oxime.

Using the resultant solar cell modules, evaluation was conducted in the same manner as in Example 1.

The results obtained are collectively shown in Table 1.

EXAMPLE 6

The procedures of Example 1 were repeated, except that the silane coupling agent used in the formation of the transparent resin thin film layer in Example 1 was replaced by γ-glycidoxypropyltrimethoxysilane.

Using the resultant solar cell modules, evaluation was conducted in the same manner as in Example 1.

The results obtained are collectively shown in Table 1.

EXAMPLE 7

The procedures of Example 1 were repeated, except that fine particles of silicon oxide having a mean particle size of 10 $\mu$m were additionally used in the formation of the transparent resin thin film layer in Example 1.

Using the resultant solar cell modules, evaluation was conducted in the same manner as in Example 1.

The results obtained are collectively shown in Table 1.

Comparative Example 1

The procedures of Example 1 were repeated, except that no silane coupling agent was used in the formation of the transparent resin thin film layer in Example 1.

Using the resultant solar cell modules, evaluation was conducted in the same manner as in Example 1.

The results obtained are collectively shown in Table 1.

Comparative Example 2

The procedures of Example 1 were repeated, except that the transparent thin film layer used in Example 1 was replaced by a 460 $\mu$m thick EVA film.

Using the resultant solar cell modules, evaluation was conducted in the same manner as in Example 1.

The results obtained are collectively shown in Table 1.

Comparative Example 3

The procedures of Example 1 were repeated, except that the transparent thin film layer used in Example 1 was not used.

Using the resultant solar cell modules, evaluation was conducted in the same manner as in Example 1.

The results obtained are collectively shown in Table 1.

TABLE 1

| | combusti-bility | heat resistance | adhesion | endurance against changes in environmental temperature | weatherability | electrical insulation | resistance to scratching |
|---|---|---|---|---|---|---|---|
| Example 1 acrylic/inorg. polymer | ○ | ○ | ○ | ◎ | ◎ | ○ | ○ |
| Example 2 acrylic/inorg. polymer | ○ | ○ | ○ | ◎ | ◎ | ○ | ○ |
| Example 3 acrylic/inorg. polymer | ○ | ○ | ○ | ◎ | ◎ | ○ | ○ |
| Example 4 acrylic/inorg. polymer | ○ | ○ | ○ | ○ | ◎ | ○ | ○ |
| Example 5 acrylic/inorg. polymer | ○ | ○ | ○ | ○ | ○ | ○ | ○ |
| Example 6 acrylic/inorg. polymer | ○ | ○ | ○ | ○ | ○ | ○ | ○ |
| Example 7 acrylic/inorg. polymer | ○ | ○ | ○ | ○ | ◎ | ○ | ◎ |
| Comparative Example 1 | ○ | X | X | X | X | X | X |
| Comparative Example 2 | X | X | — | ○ | ○ | ○ | ○ |
| Comparative Example 3 | ○ | ○ | — | ○ | ○ | X | X |

Based on the results shown in Table 1, the following facts are understood. That is, by using a specific transparent resin film layer containing a silane coupling agent, particularly, an epoxy series silane coupling agent and diminishing the amount of EVA used, there can be attained a highly reliable surface covering material for a semiconductor element (specifically, a photoelectric conversion element), in which said transparent resin thin film layer always secures a sufficient adhesion with not only the transparent electrode of the semiconductor element but also the transparent organic resin layer situated above the transparent resin thin film layer even under environmental conditions with a high temperature and which is always maintained in a desirable state without being yellowed even upon repeated used under severe environmental conditions with a high temperature and a high humidity.

As for a surface covering material having a transparent resin thin film layer formed using ε-caprolactam but using no epoxy series silane coupling agent, it is liable to yellow upon repeated use under environmental condition with a high temperature. As for the reason for this, it is considered that EVA contained in the surface covering material liberates acetic acid when it is oxidized and deteriorated and the acetic acid thus liberated reacts with ε-caprolactam remaining in the transparent resin thin film layer to yellow the surface covering material. However, the incorporation of the epoxy series silane coupling agent into the transparent resin thin film layer eliminates the occurrence of the yellowing problem. That is, the epoxy series silane coupling agent functions to trap the liberated acetic acid, whereby the yellowing problem is effectively prevented from occurring.

Further, even in the case where EEA is used instead of EVA, no acid generation occurs in acid decomposition reaction of the EEA. This also prevents the surface covering material from being yellowed. However, in the case of using methyl ethyl ketone oxime (that is, MEK oxime), although yellowing of the surface covering material can be prevented, there is a drawback such that during the process of forming a coating film by way of heat treatment, the MEK oxime decomposes to produce a highly reactive nitrogen compound and because of this, the probability of yellowing of the surface covering material is greater than that in the case of using ε-caprolactam and upon repeated use over a long period of time, the surface covering material is liable to yellow.

Further, as is apparent from the evaluation results obtained in the endurance test against changes in environmental temperature and the environment resistance tests including the weatherability test, it is understood that each of the solar cell modules obtained in the examples belonging to the present invention is free of the occurrence of layer separation in the stacked body and maintains its original exterior appearance without being damaged. In addition, as for the electrical insulation, each of the solar cell modules obtained in the examples belonging to the present invention has an excellent initial state in terms of exterior electrical insulation and even after various endurance tests, still maintains a satisfactory electrical insulation state.

Hence, it is understood that each of the solar cell modules obtained in the examples belonging to the present invention excels in module characteristics and can be safely repeatedly used over a long period of time and therefore, is highly reliable.

As is apparent from the above description, according to the present invention, in a semiconductor device such as a solar cell module in which at least the incident light side surface of a semiconductor element is sealed by a transparent resin layer and at least a transparent organic high-molecular resin layer, by incorporating into the transparent resin layer a silane coupling agent, particularly, a compound represented by the general formula $XSiY_3$ with X being a reactive organic functional group and Y being a hydrolyzable group, there can be attained a highly reliable surface covering material which is hardly deformed and hardly peeled and excels in heat resistance even upon repeated use under such severe environmental conditions that the solar cell module is heated to a high temperature with repeated irradiation of direct sunlight in the outdoors. In addition, there can be attained a highly reliable surface covering material for a solar cell module which is hardly yellowed and excels in heat resistance and which therefore effectively maintains the solar cell characteristics in a desirable state without being deteriorated even upon repeated use under severe environmental conditions with a high temperature and a high humidity.

What is claimed is:

1. A photoelectric conversion element having a light receiving face side provided with a transparent and conductive layer, said light receiving face side being covered by a transparent layer formed of a resin obtained by crosslinking an acrylic resin and an inorganic polymer as a main component, said resin containing an epoxy series silane coupling agent.

2. A semiconductor element according to claim 1, wherein the silane coupling agent includes a compound represented by the general formula $XSiY_3$ with X being a reactive organic functional group and Y being a hydrolyzable group.

3. A photoelectric conversion element according to claim 1, wherein the resin as the transparent layer is crosslinked by an isocyanate.

4. A photoelectric conversion element according to claim 3, wherein the isocyanate comprises one or both of hexamethylenediisocyanate or 1,3-bis (isocyanatemethyl) cyclohexane.

5. A semiconductor element according to claim 3, wherein the isocynate has an isocyanate group masked by ε-caprolactam.

6. A semiconductor element according to claim 1, wherein the epoxy series silane coupling agent comprises at least one member selected from the group consisting of
γ-gylcidoxypropyltrimethoxysilane,
γ-gylcidoxypropyltriethoxysilane, and β-(3,4-epoxycyclohexyl)ethyltrimethoxysilane.

7. A photoelectric conversion element according to claim 1, wherein the transparent and conductive layer comprises an ITO film.

8. A solar cell module comprising (a) a photoelectric conversion element having a light receiving face side provided with a transparent and conductive layer, (b) a transparent layer formed of a resin obtained by crosslinking an acrylic resin and an inorganic polymer as a main constituent and which is disposed to cover said light receiving side of said photoelectric conversion element, and (c) an organic resin layer comprising a transparent thermoplastic polyolefin resin disposed to cover said transparent layer (b), said transparent layer (b) containing an epoxy series silane coupling agent.

9. A semiconductor device according to claim 8, wherein the silane coupling agent includes a compound represented by the general formula $XSiY_3$ with X being a reactive organic functional group and Y being a hydrolyzable group.

10. A semiconductor device according to claim 9, wherein the X and Y of the general formula $XSiY_3$ are respectively a glicidoxypropynyl group and an alkoxy group.

11. A solar cell module according to claim 8, wherein the resin as the transparent layer is crosslinked by an isocyanate.

12. A solar cell module according to claim 11, wherein the isocyanate comprises one or both of hexamethylenediisocyanate or 1,3-bis (isocyanatemethyl) cyclohexane.

13. A semiconductor device according to claim 11, wherein the isocynate has an isocyanate group masked by ε-caprolactam.

14. A semiconductor device according to claim 8, wherein the epoxy series silane coupling agent comprises at least one member selected from the group consisting of
γ-gylcidoxypropyltrimethoxysilane,
γ-gylcidoxypropyltriethoxysilane, and β-(3,4-epoxycyclohexyl)ethyltrimethoxysilane.

15. A solar cell module according to claim 8, wherein the transparent thermoplastic polyolefin resin is a resin selected from the group consisting of ethylene-vinyl acetate copolymer and ethylene-ethyl acrylate copolymer.

16. A solar cell module according to claim 8, wherein the transparent layer is a layer formed by means of a film-coating process.

17. A solar cell module according to claim 8, wherein the photoelectric conversion element comprises a semiconductor active layer formed on an electrically conductive substrate as a first electrode and the transparent and conductive layer as a second electrode.

18. A semiconductor device according to claim 17, wherein the semiconductor active layer comprises a non-single crystal semiconductor thin film.

19. A semiconductor device according to claim 17, wherein the non-single crystal semiconductor thin film is composed of an amorphous silicon material.

20. A solar cell module according to claim 8, wherein the transparent and conductive layer comprises an ITO film.

21. A photoelectric conversion device comprising a photoelectric conversion element having a light receiving surface, and a transparent layer provided on said light receiving surface, wherein said transparent layer is derived from a resin containing a silane coupling agent.

22. A photoelectric conversion device according to claim 21, wherein the silane coupling agent includes a compound represented by the general formula $XSiY_3$, with X being a reactive organic functional group and Y being a hydrolyzable group.

23. A photoelectric conversion device according to claim 21, wherein the silane coupling agent includes an epoxy series silane coupling agent.

24. A photoelectric conversion device according to claim 23, wherein the epoxy series silane coupling agent comprises at least one member selected from the group consisting of
γ-gylcidoxypropyltrimethoxysilane,
γ-gylcidoxypropyltriethoxysilane, and
β-(3,4-epoxycyclohexyl)ethyltrimethoxysilane.

25. A photoelectric conversion device according to claim 21, wherein the resin is crosslinked by an isocyanate.

26. A photoelectric conversion device according to claim 25, wherein the isocyanate comprises one or both of hexamethylenediisocyanate or 1,3-bis(isocyanatemethyl) cyclohexane.

27. A photoelectric conversion device according to claim 25, wherein the isocyanate has an isocyanate group masked by ε-caprolactam.

28. A photoelectric conversion device according to claim 21, wherein the resin comprises an acrylic resin.

29. A photoelectric conversion device according to claim 21, wherein the resin comprises a resin obtained by crosslinking an acrylic resin and an inorganic polymer.

30. A photoelectric conversion device according to claim 21, wherein the photoelectric conversion element is a solar cell element.

31. A solar cell module comprising:
(a) a photoelectric conversion element having a light receiving surface,
(b) a transparent layer provided on said light receiving surface, and
(c) an organic resin layer provided on said transparent layer,
wherein said transparent layer is derived from a resin containing a silane coupling agent.

32. A solar cell module according to claim 31, wherein the silane coupling agent includes a compound represented by the general formula $XSiY_3$, with X being a reactive organic functional group and Y being a hydrolyzable group.

33. A solar cell module according to claim 31, wherein the silane coupling agent includes an epoxy series silane coupling agent.

34. A solar cell module according to claim 33, wherein the epoxy series silane coupling agent comprises at least one member selected from the group consisting of
γ-gylcidoxypropyltrimethoxysilane,
γ-gylcidoxypropyltriethoxysilane, and
β-(3,4-epoxycyclohexyl) ethyltrimethoxysilane.

35. A solar cell module according to claim 31, wherein the resin is crosslinked by an isocyanate.

36. A solar sell module according to claim 35, wherein the isocyanate comprises one or both of hexamethylenediisocyanate or 1,3-bis(isocyanatemethyl) cyclohexane.

37. A solar cell module according to claim 35, wherein the isocyanate has an isocyanate group masked by ε-caprolactam.

38. A solar cell module according to claim 31, wherein the resin comprises an acrylic resin.

39. A solar cell module according to claim 31, wherein the resin comprises a resin obtained by crosslinking an acrylic resin and an inorganic polymer.

40. A solar cell module according to claim 31, wherein the organic resin layer comprises a transparent thermoplastic polyolefin resin.

41. A solar cell module according to claim 40, wherein the transparent thermoplastic polyolefin resin is a resin selected from the group consisting of ethylene-vinyl acetate copolymer and ethylene-ethyl acrylate copolymer.

42. A solar cell module according to claim 31, wherein the organic resin layer is a layer formed by means of a film-coating process.

43. A solar cell module according to claim 31, wherein the photoelectric conversion element comprises an electrically conductive substrate as a first electrode, a semiconductor active layer which is provided on said electrically conductive substrate, a transparent and conductive layer as a second electrode which is provided on said semiconductor layer.

44. A solar cell module according to claim 43, wherein the semiconductor active layer comprises a non-single crystal semiconductor thin film.

45. A solar cell module according to claim 44, wherein the non-single crystal semiconductor thin film is composed of an amorphous silicon material.

46. A solar cell module according to claim 43, wherein the transparent and conductive layer comprises an ITO film.

* * * * *

UNITED STATES PATENT AND TRADEMARK OFFICE
CERTIFICATE OF CORRECTION

PATENT NO. : 6,130,379  
DATED : October 10, 2000  
INVENTOR(S) : Hidenori Shiotsuka et al.

Page 1 of 2

It is certified that error appears in the above-identified patent and that said Letters Patent is hereby corrected as shown below:

Fig. 1,
Sheet 1 of 4, "FIG. 1" should read -- FIG. 1 PRIOR ART --.

Column 4,
Line 61, "in" should read -- is --.

Column 6,
Line 27, "film)" should read -- film), --.

Column 7,
Line 48, "CdS/CU$_2$S/CdTe," should read -- CdS/Cu$_2$S,CdS/CdTe, --.

Column 8,
Line 38, "k$\Omega$cm$^2$" (first occurrence) should read -- k$\Omega$.cm$^2$ --.

Column 9,
Line 34, "polychlorotrif-" should read -- polychlorotri --;
Line 35, "luorethylene" should read -- fluoroethylene --;
Line 47, "ah" should read -- an --.

Column 10,
Line 1, "resin" should read -- resins --.

Column 12,
Line 21, "10phosphenanthrene-" should read -- 10-phosphenanthrene --;
Line 60, "it" should read -- it is --.

Column 15,
Line 55, "cell")" should read -- cell): --.

Column 16,
Line 49, "module" should read -- module: --.

Column 17,
Line 29, "-4piperidyl)" should read -- 4-piperidyl) --.

UNITED STATES PATENT AND TRADEMARK OFFICE
CERTIFICATE OF CORRECTION

PATENT NO. : 6,130,379
DATED : October 10, 2000
INVENTOR(S) : Hidenori Shiotsuka et al.

It is certified that error appears in the above-identified patent and that said Letters Patent is hereby corrected as shown below:

Column 19,
Line 43, "3000 $\Omega$cm," should read -- 3000$\Omega$.cm, --;
Line 48, "criteria,:" should read -- criteria: --.

Column 22,
Line 67, "semiconductor" should read -- photoelectric conversion --.

Column 23,
Line 5, "semiconductor" should read -- photoelectric conversion --;
Line 8, "semiconductor" should read -- photoelectric conversion --;
Line 27, "semiconductor device" should read -- solar cell module --;
Line 30, "semiconductor device" should read -- solar cell module --;
Line 38, "semiconductor device" should read -- solar cell module --;
Line 41, "semiconductor device" should read -- solar cell module --;
Line 60, "semiconductor device" should read -- solar cell module --;
Line 63, "semiconductor device" should read -- solar cell module --.

Signed and Sealed this

Fourth Day of December, 2001

*Attest:*

*Attesting Officer*

NICHOLAS P. GODICI
*Acting Director of the United States Patent and Trademark Office*